US009309488B2

(12) United States Patent
Koellnberger

(10) Patent No.: US 9,309,488 B2
(45) Date of Patent: Apr. 12, 2016

(54) SILICONE SOLVENT

(71) Applicant: Wacker Chemie AG, Munich (DE)

(72) Inventor: Andreas Koellnberger, Kirchdorf (DE)

(73) Assignee: WACKER CHEMIE AG, Munich (DE)

( * ) Notice: Subject to any disclaimer, the term of this patent is extended or adjusted under 35 U.S.C. 154(b) by 124 days.

(21) Appl. No.: 14/362,783

(22) PCT Filed: Dec. 6, 2012

(86) PCT No.: PCT/EP2012/074661
§ 371 (c)(1),
(2) Date: Jun. 4, 2014

(87) PCT Pub. No.: WO2013/087510
PCT Pub. Date: Jun. 20, 2013

(65) Prior Publication Data
US 2014/0336093 A1 Nov. 13, 2014

(30) Foreign Application Priority Data
Dec. 16, 2011 (DE) .......................... 10 2011 088 885

(51) Int. Cl.
C11D 7/16 (2006.01)
H01L 21/311 (2006.01)
C09D 9/00 (2006.01)
C11D 7/08 (2006.01)
C11D 7/26 (2006.01)
C11D 7/32 (2006.01)
C11D 11/00 (2006.01)
C11D 3/24 (2006.01)

(52) U.S. Cl.
CPC *C11D 7/16* (2013.01); *C09D 9/005* (2013.01); *C11D 7/08* (2013.01); *C11D 7/26* (2013.01); *C11D 7/3209* (2013.01); *C11D 11/0047* (2013.01); *H01L 21/31133* (2013.01); *C11D 3/245* (2013.01)

(58) Field of Classification Search
CPC ..... C11D 11/0047; C11D 3/245; H05K 3/288
USPC ......................................... 510/175
See application file for complete search history.

(56) References Cited

U.S. PATENT DOCUMENTS

| 2,710,843 | A | 6/1955 | Stebleton |
| 5,008,229 | A | 4/1991 | Schuster et al. |
| 5,593,507 | A | 1/1997 | Inada et al. |
| 6,652,665 | B1 * | 11/2003 | Sachdev ............. B08B 3/02 134/19 |
| 6,818,608 | B2 * | 11/2004 | Moore ............... C09D 9/005 257/E21.255 |
| 7,232,770 | B2 | 6/2007 | Moore et al. |
| 2003/0148904 | A1 * | 8/2003 | Moore ............... C09D 9/005 510/201 |
| 2007/0000523 | A1 | 1/2007 | Kim et al. |
| 2009/0233827 | A1 | 9/2009 | Egbe et al. |

FOREIGN PATENT DOCUMENTS

| DE | 3725377 A1 | 2/1989 |
| DE | 19607264 A1 | 9/1996 |
| DE | 69122740 T2 | 4/1997 |
| EP | 0884368 A1 | 12/1998 |
| GB | 2298429 A | 9/1996 |
| JP | 8250400 A | 9/1996 |
| JP | 2007-19506 A | 1/2007 |
| JP | 2009-224782 A | 10/2009 |
| KR | 20090048715 A | 5/2009 |
| TW | 200938624 | 9/2009 |

OTHER PUBLICATIONS

Chinese Office Action dated May 26, 2015, Application No. 2014-0546428, 5 pages. (No English Translation).

* cited by examiner

*Primary Examiner* — Gregory Webb
(74) *Attorney, Agent, or Firm* — Brooks Kushman P.C.

(57) ABSTRACT

Cured or uncured silicones are effectively removed from substrates with minimized substrate corrosion by the use of a silicone dissolver containing a tetralkylammonium fluoride and an inorganic base, dissolved in a solvent.

5 Claims, No Drawings

SILICONE SOLVENT

CROSS-REFERENCE TO RELATED APPLICATIONS

This application is the U.S. National Phase of PCT Appln. No. PCT/EP2012/074661 filed Dec. 6, 2012, which claims priority to German Application No. 10 2011 088 885.3 filed Dec. 16, 2011, the disclosures of which are incorporated in their entirety by reference herein.

BACKGROUND OF THE INVENTION

1. Field of the Invention

The present invention relates to a composition for depolymerization and removal of silicone residues.

2. Description of the Related Art

Various methods and compositions for removing or depolymerizing crosslinked or uncrosslinked silicones are known in the prior art. These include, for example: Swelling and removing with an organic or halogenated organic solvent; Swelling and removing with an amine such as diisopropylamine; Depolymerizing the polydimethylsiloxane with alkaline solutions of strong bases such as sodium hydroxide or potassium hydroxide as described, for example, in U.S. Pat. No. 2,710,843; Depolymerizing with short-chain or cyclic oligodiorganosiloxanes as described, for example, in DE 69122740 T2; Depolymerizing with aqueous solutions of strong acids such as alkylbenzenesulphonic acids, or sulphuric acid, hydrofluoric acid as described, for example, in JP 8250400 A; and Depolymerizing with a composition containing phosphonitrile halide compounds and short-chain oligodimethylsiloxanes of up to 7 Si-chain members as described, for example, in EP 0 884 368 A1.

The contrary use of cyclic or linear phosphonitrile halide compounds as chain growth addition or condensation polymerization catalyst to prepare long-chain polydimethylsiloxanes is long-established prior art, as is using the catalyst to equilibrate polydimethylsiloxanes as described in DE 196 07 264 A1.

U.S. Pat. No. 5,008,229 is directed to solutions of phosphonitrile chlorides in an organic solvent and the use of such compositions to accelerate the condensation and/or equilibration of hydroxyl-terminated diorganosiloxanes. Although improved results are obtained, an organic solvent such as ethyl acetate is used to facilitate the dissolution of the phosphonitrile chloride. DE 37 25 377 eliminates the use of an organic solvent by using a reaction product of a phosphorus-nitrogen chloride and of a cyclic diorganosiloxane, such as octamethylcyclotetrasiloxane, as a catalyst. Experience has shown, however, that reaction products of phosphorus-nitrogen chloride and octamethylcyclotetrasiloxane frequently have viscosities exceeding several thousand mPa·s (centipoises), making the materials less useful as catalysts for removing polydimethylsiloxane residues.

U.S. Pat. No. 7,232,770 B1 describes ammonium fluorides combined with amines in various solvents for removing silicone residues in the semiconductor sector.

The disadvantage of all previously known compositions for dissolving silicone is that they contain corrosive substances such as, for example, organic acids or alkalis which, when used to remove silicones from diverse substrates, lead to surface corrosion of metals.

SUMMARY OF THE INVENTION

An object of the present invention was therefore that of providing a composition that is useful for removing crosslinked and uncrosslinked polysiloxane residues from diverse substrates or between substrates, but at the same time is inert with regard to the substrates and does not damage or corrode them even as a thin layer during the treatment time to remove silicone impurities.

These and other objects were surprisingly solved by a silicone dissolver containing an alkyl-ammonium fluoride, an inorganic basic salt and a solvent. The composition of the present invention is particularly useful for removing crosslinked or uncrosslinked, filled or unfilled silicone residues from sensitive surfaces and substrates. The silicone dissolver can be liquid, pasty or gel-like in the various applications, depending on the field of use.

DETAILED DESCRIPTION OF THE PREFERRED EMBODIMENTS

The silicone dissolver of the present invention thus contains

A) at least one tetraalkylammonium fluoride,
B) at least one inorganic base capable of binding hydrogen ions, and
C) at least one solvent suitable for dissolving not only the tetraalkylammonium fluoride A) but also at least 0.001 wt % of inorganic base B).

It was surprisingly found that inorganic salts are particularly useful for suppressing the corrosive effect of a silicone-dissolving composition comprising an organic tetraalkylammonium fluoride and a solvent.

The silicone dissolvers of the present invention are particularly useful for removing polysiloxane residues or layers on or between substrates.

The silicone dissolvers of the present invention have the advantage that they act selectively on silicone polymers and/or polydimethylsiloxane groups. Other plastics are not attacked, owing to the mechanism of the reaction. Examples of plastics that are inert toward the silicone dissolvers of the present invention are: polyolefin, polystyrene, polyvinyl chloride, polyethylene, polypropylene, polynitrile, acrylonitrile-butadiene-styrene copolymers, polyimides, or polyacrylate.

Silicone dissolvers of the present invention dissolve, for example addition-crosslinked, condensation-crosslinked and peroxidically crosslinked silicone rubbers such as RTV-1, RTV-2, LSR and HTV. The silicone dissolvers of the present invention are also effective in relation to silicone rubbers which, depending on the field of use, contain further components such as fillers, for example hydrophilic or hydrophobic silicas, precipitated silicas, silicone resins, aluminium oxides, titanium oxides, carbon blacks, graphites, metals, metal carbonates, diatomaceous earths, metal dusts, fibres such as glass fibres or polymeric fibres and miscellaneous additives such as fungicides, scents, corrosion inhibitors, oxidation inhibitors, light stabilizers, flame retardants, dispersants, adhesion promoters, pigments, plasticizers, organic polymers or heat stabilizers. The silicone dissolvers of the present invention also degrade copolymers containing polydiorganosiloxane units or silicone resins.

In one preferred embodiment, component A) conforms to general formula (1):

$$(C_nH_{2n+1})_4N^+F^- \tag{1}$$

where
n is from 1 to 30, preferably n is from 1 to 18 and more preferably n is from 1 to 10.

Compounds A) are long known in the art and are commercially available. Examples of preferred compounds A) are:

tetramethylammonium fluoride, tetraethylammonium fluoride, tetrabutylammonium fluoride, tetrapentylammonium fluoride, tetrahexylammonium fluoride, tetraheptylammonium fluoride, tetraoctylammonium fluoride, tetranonylammonium fluoride, tetradecylammonium fluoride, tetraisopropylammonium fluoride, tetraisobutylammonium fluoride, tetra(tert-butyl)ammonium fluoride, and tetra(tert-pentyl) ammonium fluoride.

In one preferred embodiment, component B) is selected from the following group of inorganic salts wherein M is selected from the group of alkali and alkaline earth metals and also monovalent cations such as, for example, the ammonium ion:
phosphorous and phosphoric acid salts $M_oH_pPO_3$ and $M_oH_pPO_4$ where o=1 to 3 (empirical formula illustratively based on a monovalent metal cation) and p=0 to 2, sulphurous and sulphuric acid salts $M_qH_rSO_3$, $M_qH_rSO_4$ where q=1 to 2, r=0 to 1,
nitrous and nitric acid salts $MNO_2$ and $MNO_3$ (empirical formula illustratively based on a monovalent metal cation). Sodium, potassium, magnesium, calcium and ammonium are preferred as M. Particularly preferred compounds B) are $Na_3PO_4$, $Na_2HPO_4$, $NaH_2PO_4$, $MgHPO_4$, $Mg_3(PO_4)_2$, $(NH_4)H_2PO_4$, $(NH_4)_2HPO_4$, $(NH_4)_3PO_4$.

Component C) is a solvent capable of dissolving component A) and at least 0.001 wt % of component B). Examples of component C) are linear, branched and cyclic ethers which can also contain further heteroatoms such as nitrogen, phosphorus or halogen atoms. Examples of ethers useful as solvents include but are not limited to dialkyl ethers: diethyl ether, di-n-propyl ether, diisopropyl ether, dibutyl ether, dipentyl ether, dihexyl ether, dioctyl ether, 2-ethylhexyl vinyl ether, 4-chlorobutyl ether, dichloromethyl methyl ether, 1,2-dimethoxypropane, tert-amyl methyl ether, tert-butyl ethyl ether, di-sec-butyl ether, tetraethylene glycol dimethyl ether; cyclic ethers: oxacyclopentane (tetrahydrofuran), oxacycloheptane (tetrahydropyran), 1,4-dioxane; ethers comprising aromatic groups: methyl phenyl ether, 2-nitrophenyl phenyl ether, 4-dimethoxybenzene, 1,3,5-trimethoxybenzene, butyl phenyl ether, and 1,4-diethoxybenzene.

A further class of substances very useful as component C) is that of the ketones, which contains linear, branched and cyclic compounds which may additionally contain further heteroatoms such as nitrogen, phosphorus or halogen atoms. Linear and branched aliphatic molecules are particularly preferred.

Examples of ketones useful as component C) include but are not limited to:
2-propanone, 2-butanone, 2-pentanone, 2-hexanone, 2-heptanone, 2-octanone, 2-nonanone, 2-decanone, 3-hexanone, 3-heptanone, 3-octanone, 3-nonanone, 3-decanone, 2-methyl-3-butanone, 3,3-dimethyl-2-butanone, 2-methyl-3-pentanone, 2-methyl-3-hexanone, 2-methyl-3-heptanone, 4-heptanone, 4-octanone, 4-nonanone, 4-decanone, 2,2-dimethyl-3-pentanone, 2,4-dimethyl-3-pentanone, 5-methyl-3-heptanone, 4,4-dimethyl-2-pentanone, 2,2,4,4-tetramethyl-3-pentanone, 3-methyl-2-pentanone, 4-methyl-2-pentanone, 3,3-dimethoxy-2-butanone, 4,4-dimethoxy-2-butanone, 3-methyl-2-cyclohanone, 3-methyl-2-cyclohexenone, 1,3-cycloheptanedione, 2-methyl-1,3-cyclohexanedione, 3-ethoxy-2-cyclopenten-1-one, 5-methyl-1,3-cyclohexanedione, triacetylmethane, 2,2-dimethylcyclopentanone, 2-methylcyclohexanone, 3-methylcyclohexanone, 4-methylcyclohexanone, cycloheptanone, and diethylaminoacetone.

A further class of substances very useful as component C) is that of the esters, which contains linear, branched and cyclic compounds which may additionally contain further heteroatoms such as nitrogen, phosphorus or halogen atoms.

Particular preference is given to esters which are deemed to be a dipolar aprotic solvent. Examples of esters useful as component C) include but are not limited to:
alkyl carboxylate esters, methyl acetate, ethyl acetate, propyl acetate, butyl acetate, pentyl acetate, hexyl acetate, heptyl acetate, octyl acetate, nonyl acetate, methyl propionate, ethyl propionate, propyl propionate, butyl propionate, pentyl propionate, hexyl propionate, heptyl propionate, and octyl propionate.

C) is preferably selected from the group of the following solvents: alkyl carboxylate esters, dialkyl ethers, alkyl aryl ethers, and ketones. C) is more preferably selected from the group of ethyl acetate, propyl acetate, isopropyl acetate, 2-butanone, 2-octanone, isopropyl methyl ketone, and tert-butyl methyl ketone.

By way of further optional constituents, silicone dissolvers of the present invention may contain thickeners D) in order to adjust the viscosity and produce pasty compositions for example. Examples of thickeners D) are: precipitated silica, hydrophilic or hydrophobic colloidal silica, aluminium oxide, titanium dioxide, calcium salts of carboxylic acids, carbon blacks or carboxymethylcellulose. Any thickener D) known in the prior art can be used as long as it has a water content below 5000 ppm. The water content should preferably be below 2500 ppm and more preferably below 1000 ppm. Organic aliphatic alcohol groups must also be avoided in the composition since they, similarly to water, cause component A) to hydrolyse and the silicone dissolver would lose its equilibration property. It is preferable for D) to be selected from the group of pyrogenous silicas.

The silicone dissolver of the present invention is prepared by mixing A) with B) and C) and possibly D) ideally until a clear solution has formed.

It is preferable to use 0.1-10 wt % of A) and more preferably 0.1-5 wt % of A) per 100 wt % of silicone dissolver. It is preferable to use from 0.001 to 1 wt % of B) and more preferably 0.01-0.5 wt % of B) per 100 wt % of silicone dissolver. C) contributes the remainder to the 100 wt % of silicone dissolver.

Mixing is typically effected by intensively stirring the components for between 0.5 and 10 hours at room temperature or elevated temperature (up to 140° C.)

When thickeners D) are used, this is done to adjust the viscosity of the silicone dissolver of the present invention to a defined range. For this, thickener D) is used in amounts of 0.1-30 wt % per 100 wt % of silicone dissolver. It is preferable to add from 0.5 to 10 wt % and more preferably from 1 to 5 wt % of D).

The present invention further provides for the use of the silicone dissolver of the present invention for depolymerization and removal of crosslinked or uncrosslinked silicone residues from surfaces or substrates.

Depending on the viscosity of the silicone dissolvers according to the present invention—liquid, pasty or gel-like—this is effected in various ways, for example by spraying or carrying the silicone dissolver of the present invention onto the article/surface/substrate to be cleaned or else by dipping the article to be cleaned into the silicone dissolvers of the present invention. Depending on the layer thickness and composition of the silicone residues to be removed, the treatment time can be between 10 s and several hours. In one preferred embodiment, treatment time is between 30 s and 10 min. Temperature elevation during treatment time accelerates the dissolving process. Depending on solvent C), temperatures between 20° C. and 150° C. can be used, while the temperature range from 20° C. to 100° C. can be stated to be preferable. Any circulation of the silicone dissolver according to the present invention, for example by pumping, shaking or ultrasonication, likewise has an accelerating effect. In one preferred embodiment, the treatment time at room temperature under ultrasonication is between 10 s and 5 min. In a further preferred embodiment, the treatment time at 50° C.-120° C. under ultrasonication is between 10 s and 3 min.

Following the treatment time period, the scissioned products are washed off with a solvent without additives which can be but need not be identical to the solvent C) used in the dissolving reaction.

EXAMPLES

The examples which follow illustrate the invention without limiting it. Parts are by weight, unless otherwise stated. The examples hereinbelow are carried out at a pressure of the surrounding atmosphere, i.e. approximately at 1000 hPa and, unless otherwise stated, at room temperature, i.e. about 20° C. In application examples of dissolving crosslinked silicone elastomers, ultrasonication is effected by introducing a glass flask into an ultrasonic bath (Bandelin RM 40), by introducing an ultrasonic probe, or the like.

Example 1

Silicone-Dissolving Composition 1

A 2.5 g quantity of tetrabutylammonium fluoride and 0.05 g of trisodium phosphate are dissolved in 97.45 g of 2-octanone at room temperature by stirring for 30 min.

Example 2

Silicone-Dissolving Composition 2

A 2.5 g quantity of tetrabutylammonium fluoride and 0.05 g of disodium hydrogen phosphate are dissolved in 97.45 g of 2-octanone at room temperature by stirring for 30 min.

Example 3

Silicone-Dissolving Composition 3

A 2.5 g quantity of tetrabutylammonium fluoride and 0.05 g of calcium hydroxide are dissolved in 97.45 g of n-propyl acetate at room temperature by stirring for 30 min.

Example 4

Silicone-Dissolving Composition 4

A 2.5 g quantity of tetrabutylammonium fluoride and 0.05 g of trisodium phosphate are dissolved in 97.45 g of n-propyl acetate at room temperature by stirring for 30 min.

Example 5

Silicone-Dissolving Composition 5

A 2.5 g quantity of tetrabutylammonium fluoride and 0.05 g of disodium hydrogen phosphate are dissolved in 97.45 g of n-propyl acetate at room temperature by stirring for 30 min.

Example 6

Silicone-Dissolving Composition 6

A 2.5 g quantity of tetrabutylammonium fluoride and 0.05 g of calcium hydroxide are dissolved in 97.45 g of 2-octanone at room temperature by stirring for 30 min.

Example 7

Silicone-Dissolving Composition 7 (Not in Accordance with the Present Invention)

A 2.5 g quantity of tetrabutylammonium fluoride is dissolved in 97.5 g of 2-octanone at room temperature by stirring for 30 min.

Example 8

Silicone-Dissolving Composition 8 (Not in Accordance with the Present Invention)

A 2.5 g quantity of tetrabutylammonium fluoride is dissolved in 97.5 g of n-propyl acetate at room temperature by stirring for 30 min.

Example 9

Dissolving a Polydimethylsiloxane Composition

One square centimeter in each case of a 100 μm thin layer of a crosslinked silicone composition (ELASTOSIL® LR 3003/40 from Wacker Chemie AG, Munich) is overcoated with 5 ml of each solution from Examples 1 to 8 at room temperature. The time to complete dissolution of the film was 10-20 seconds for each and every composition.

Example 10

Aluminium Corrosion

To assess corrosion, one square centimeter of a commercially available aluminium foil was placed in each solution and removed therefrom at the stated time within any one series. Corrosion was assessed from scanning electron micrographs differentiated in Table 1 into "minus"="−" (no visible corrosion in SEM) and "plus"="+" (SEM shows visible corrosion, i.e. pitting, local dissolution of aluminium).

TABLE 1

| Ex. | Time of removal | | | | | | | |
|---|---|---|---|---|---|---|---|---|
|  | 2 min | 4 min | 6 min | 8 min | 10 min | 20 min | 30 min | 60 min |
| 1 | − | − | − | − | − | − | − | + |
| 2 | − | − | − | − | − | − | + | + |
| 3 | − | − | − | − | − | − | − | + |
| 4 | − | − | − | − | − | − | + | + |
| 5 | − | − | − | − | − | − | + | + |
| 6 | − | − | − | − | − | − | − | + |
| 7 | − | − | + | + | + | + | + | + |
| 8 | − | − | + | + | + | + | + | + |

As is apparent from Table 1, the surprising finding was that silicone dissolvers which are in accordance with the present invention are particularly useful for removing silicone residues coupled with distinctly reduced corrosion of aluminium. A treatment time of a few minutes is normally sufficient at room temperature.

The invention claimed is:

1. A process for depolymerization and removal of crosslinked or uncrosslinked silicone residues from surface(s) or substrate(s), comprising contacting the surface(s) or substrate(s) with a silicone dissolver comprising:
    A) at least one tetraalkylammonium fluoride,
    B) at least one inorganic base capable of binding hydrogen ions, and
    C) at least one solvent suitable for dissolving not only the tetraalkylammonium fluoride A) but also at least 0.001 wt % of inorganic base B).

2. The process of claim 1, wherein the silicone dissolver comprises:
    0.1-10 wt % of A), 0.001-1 wt % of B), and the remainder to 100 wt % of solvent C).

3. The process of claim 1, wherein at least one component A) is selected from the group consisting of: tetramethylammonium fluoride, tetraethylammonium fluoride, tetrabutylammonium fluoride, tetrapentylammonium fluoride, tetrahexylammonium fluoride, tetraheptylammonium fluoride, tetraoctylammonium fluoride, tetranonylammonium fluoride, tetradecylammonium fluoride, tetraisopropylammonium fluoride, tetraisobutylammonium fluoride, and tetra(tert-butyl)ammonium fluoride, tetra(tert-pentyl)ammonium fluoride.

4. The process of claim 1, wherein at least one component B) is selected from the group consisting of phosphorous and phosphoric acid salts $M_oH_pPO_3$ and $M_oH_pPO_4$, sulphurous and sulphuric acid salts $M_qH_rSO_3$, $M_qH_rSO_4$, and nitrous and nitric acid salts $MNO_2$ and $MNO_3$, where M is selected from the group of alkali and alkaline earth metals and of monovalent cations, o is 1 to 3 and p is 0 to 2, with the proviso that the sum of o and p are such that the component b) is neutral.

5. The process of claim 1, wherein at least one component C) is selected from the group consisting of alkyl carboxylate esters, dialkyl ethers, alkyl aryl ethers, and ketones.

* * * * *